United States Patent
Jang

(10) Patent No.: US 7,635,649 B2
(45) Date of Patent: *Dec. 22, 2009

(54) METHOD FOR MANUFACTURING SEMICONDUCTOR DEVICE

(75) Inventor: Jeong Yel Jang, Suwon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 245 days.

This patent is subject to a terminal disclaimer.

(21) Appl. No.: 11/605,552

(22) Filed: Nov. 28, 2006

(65) Prior Publication Data
US 2007/0122753 A1 May 31, 2007

(30) Foreign Application Priority Data
Nov. 28, 2005 (KR) .................. 10-2005-0114311

(51) Int. Cl.
H01L 21/3065 (2006.01)
H01L 21/308 (2006.01)
H01L 21/28 (2006.01)
H01L 21/3213 (2006.01)

(52) U.S. Cl. .......... 438/717; 430/317; 216/41; 216/49; 216/51; 216/67; 216/79; 438/585; 438/710

(58) Field of Classification Search .......... 438/710, 438/717, 729, 585; 216/41, 49, 51, 67, 71, 216/74; 430/317
See application file for complete search history.

(56) References Cited

U.S. PATENT DOCUMENTS 5,804,088 A * 9/1998 McKee .................. 216/47
5,976,769 A * 11/1999 Chapman .................. 430/316
6,010,829 A * 1/2000 Rogers et al. .............. 430/316
6,300,251 B1 * 10/2001 Pradeep et al. ............. 438/710
6,383,941 B1 * 5/2002 Shen et al. ................. 438/714
6,432,832 B1 * 8/2002 Miller et al. ............... 438/713
6,541,843 B2 * 4/2003 Yin et al. ................... 257/639
6,759,263 B2 * 7/2004 Ying et al. ................. 438/48
6,893,893 B2 * 5/2005 Nallan et al. ............... 438/61
6,949,411 B1 * 9/2005 Mikhaylichenko et al. .. 438/115
6,964,928 B2 * 11/2005 Ying et al. ................. 438/706
7,094,613 B2 * 8/2006 Mui et al. .................. 438/9
7,105,361 B2 * 9/2006 Chen et al. ................. 438/3
7,192,878 B2 * 3/2007 Weng et al. ................ 438/734
7,195,716 B2 * 3/2007 Chou ........................ 216/41
7,229,925 B2 * 6/2007 Kim ......................... 438/689
2003/0092281 A1 * 5/2003 Ramachandramurthy et al. .......................... 438/725

(Continued)

FOREIGN PATENT DOCUMENTS

KR 10-2001-0048887 2/2003

(Continued)

*Primary Examiner*—M. Wilczewski
(74) *Attorney, Agent, or Firm*—Saliwanchik, Lloyd & Saliwanchik

(57) ABSTRACT

A method for manufacturing a semiconductor device is provided. The method includes forming a polysilicon layer on a semiconductor substrate, forming an anti-reflection coating on the polysilicon layer, forming a photoresist (PR) layer pattern on the anti-reflection coating, etching the anti-reflection coating using the PR layer pattern as a mask in capacitive coupled plasma (CCP) equipment using $CF_4$, Ar, and $O_2$, so as to cause a reaction by-product generated by etching the anti-reflect coating to be deposited on sidewalls of the PR layer pattern, thereby forming spacers, and etching the polysilicon layer using the PR layer pattern and the spacers as a mask.

13 Claims, 6 Drawing Sheets

U.S. PATENT DOCUMENTS

| | | | |
|---|---|---|---|
| 2003/0180968 A1* | 9/2003 | Nallan et al. | 438/3 |
| 2004/0026369 A1* | 2/2004 | Ying et al. | 216/63 |
| 2004/0029393 A1* | 2/2004 | Ying et al. | 438/745 |
| 2004/0038436 A1* | 2/2004 | Mori et al. | 438/17 |
| 2004/0043526 A1* | 3/2004 | Ying et al. | 438/38 |
| 2004/0043620 A1* | 3/2004 | Ying et al. | 438/710 |
| 2004/0203242 A1* | 10/2004 | Stojakovic et al. | 438/690 |
| 2006/0076313 A1* | 4/2006 | Chou | 216/41 |
| 2006/0276018 A1* | 12/2006 | Nam et al. | 438/585 |
| 2007/0037396 A1* | 2/2007 | Verhaverbeke | 438/689 |
| 2007/0042603 A1* | 2/2007 | Kropewnicki et al. | 438/689 |
| 2007/0054491 A1* | 3/2007 | Chen | 438/689 |
| 2007/0059937 A1* | 3/2007 | Kang | 438/703 |
| 2007/0077782 A1* | 4/2007 | Lee et al. | 438/781 |
| 2007/0082481 A1* | 4/2007 | Jung | 438/629 |
| 2007/0122753 A1* | 5/2007 | Jang | 430/316 |
| 2007/0125750 A1* | 6/2007 | Weng et al. | 216/67 |

FOREIGN PATENT DOCUMENTS

KR        2004-065034    *   7/2004

* cited by examiner

METHOD FOR MANUFACTURING SEMICONDUCTOR DEVICE

RELATED APPLICATION(S)

This application claims the benefit under 35 U.S.C. §119 (e), of Korean Patent Application Number 10-2005-0114311 filed Nov. 28, 2005, which is incorporated herein by reference in its entirety.

FIELD OF THE INVENTION

The present invention relates to a method for manufacturing a semiconductor device.

BACKGROUND OF THE INVENTION

The critical dimensions (CD) of a semiconductor device are the dimensions of the smallest features that can be formed during a manufacturing process. Device scaling has resulted in an increased integration density, which has resulted in a requirement for manufacturing processes capable of decreasing the size of the CD. A logic device has the critical dimension (CD) of a transistor in inverse proportion to integration density.

When a floating gate pattern having a CD of 130 nm or less is formed, the CD of the gate pattern as well as the CD of a space between the neighboring gate lines is often reduced to 100 nm or less.

In this case, in order to secure a depth of focus (DOF) margin using a KrF light source of 248 nm, the thickness of a photoresist (PR) layer must be thin. This gives rise to a trade-off problem that the PR layer must maintain a minimum thickness required when an etching process is performed. Without a sufficient DOF margin, pattern defects such as pattern deformation, pattern collapse, etc. occur.

One solution to this problem is to change manufacturing processes by, for example, selecting a material for the PR layer capable of using an ArF light source of 193 nm instead of the KrF light source to form a polysilicon transistor. However, in this case, it is also difficult to form a space between the neighboring gate patterns up to the CD of 100 nm or less.

Hereinafter, a conventional method for manufacturing a semiconductor device having a fine pattern using a KrF light source will be described.

A conventional method for manufacturing a semiconductor device will be described below with reference to the attached figures.

FIGS. 1A through 1G are sectional views illustrating a conventional method for manufacturing a semiconductor device.

Referring to FIG. 1A, a gate insulating layer 11, a polysilicon layer 12, a first insulating layer 13, and a bottom anti-reflection coating (BARC) 14 are deposited on a substrate 10.

Then, a photoresist (PR) layer is applied to an entire top surface of the substrate 10 having the BARC 14, and is selectively exposed and developed to form a PR layer pattern 15.

Here, the BARC 14 prevents a standing wave phenomenon. The standing wave phenomenon occurs during the PR layer exposure process, where light incident onto the substrate 10 interferes with light reflected on the substrate 10. This interference, or standing wave phenomenon, causes the pattern profile to be deteriorated after exposure and development of the PR layer.

Referring to FIG. 1B, a BARC pattern 14a is formed by selectively removing the BARC 14 using the PR layer pattern 15 as a mask.

Referring to FIG. 1C, a first insulating layer pattern 13a is formed by etching the first insulating layer 13 using the PR layer pattern 15 as a mask.

Referring to FIG. 1D, after removing the PR layer pattern 15 and the BARC pattern 14a, a second insulating layer 16 is formed on an entire top surface of the polysilicon layer 12 including the first insulating layer pattern 13a.

Referring to FIG. 1E, the second insulating layer 16 is etched back to form sidewall spacers 16a on sidewalls of the first insulating layer pattern 13a. This etch-back process refers to a process of etching a target material on a plane at the same thickness by means of an anisotropic etching process.

Specifically, the second insulating layer 16 is etched so as to be completely removed from flat upper portions of both the polysilicon layer 12 and the first insulating layer pattern 13a, and to only remain on the sidewalls of the first insulating layer pattern 13a. In addition, often the sidewalls of the first insulating layer pattern 13a are partially etched on upper sides thereof.

Referring to FIG. 1F, a polysilicon layer pattern 12a is formed by etching the polysilicon layer 12 using the first insulating layer pattern 13a and the sidewall spacers 16a located on the opposite sides of the first insulating layer pattern 13a as a mask.

Referring to FIG. 1G, the first insulating layer pattern 13a and the sidewall spacers 16a, which remain on the polysilicon layer pattern 12a, are then removed.

The polysilicon layer pattern 12a formed in this way becomes a pattern for gate lines or electrodes.

In this conventional method for manufacturing a semiconductor device, the process may be complicated because the deposition and etching processes are repeated several times. Further, the number of pieces of equipment used increases because of the number of processes performed.

SUMMARY OF THE INVENTION

Accordingly, there is provided a method for manufacturing a semiconductor device, the method including: forming a polysilicon layer on a semiconductor substrate, forming an anti-reflection coating on the polysilicon layer; forming a photoresist (PR) layer pattern on the anti-reflection coating; etching the anti-reflection coating using the PR layer pattern as a mask so as to cause a reaction by-product generated by the etching of the anti-reflection coating to be deposited on sidewalls of the PR layer pattern, thereby forming spacers; and etching the polysilicon layer using the PR layer pattern and the spacers as a mask.

In another embodiment of the present invention, there is provided a method for manufacturing a semiconductor device, the method including: forming a polysilicon layer on a semiconductor substrate; forming an anti-reflection coating on the polysilicon layer; forming a photoresist (PR) layer pattern on the anti-reflection coating; etching the anti-reflection coating using the PR layer pattern as a mask so as to cause a reaction by-product generated by etching the anti-reflection coating to be deposited on sidewalls of the PR layer pattern, thereby forming spacers, where the etching of the anti-reflection coating is performed with capacitive coupled plasma (CCP) equipment using $CF_4$, Ar, and $O_2$; and etching the polysilicon layer using the PR layer pattern and the spacers as a mask.

DETAILED DESCRIPTION OF THE PREFERRED EMBODIMENTS

Hereinafter, a method of manufacturing a semiconductor device according to an exemplary embodiment of the present invention will be described with reference to the accompanying drawings.

Figure 1A:
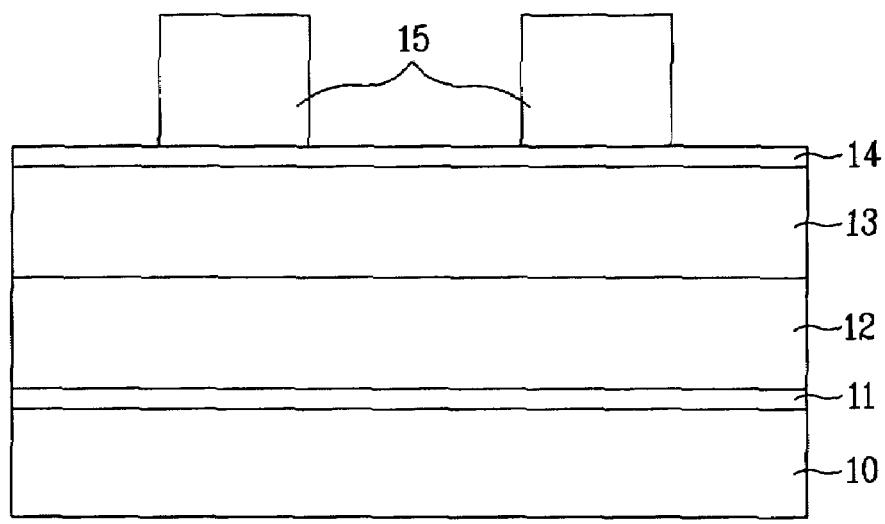
FIGS. 1A through 1G are sectional views illustrating a conventional method for manufacturing a semiconductor device.
Figure 1B:
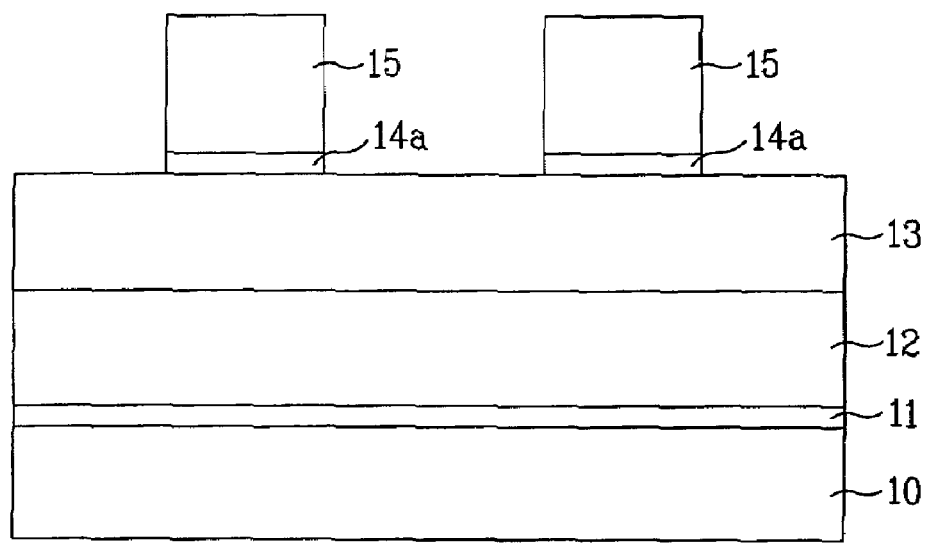
Figure 1C:
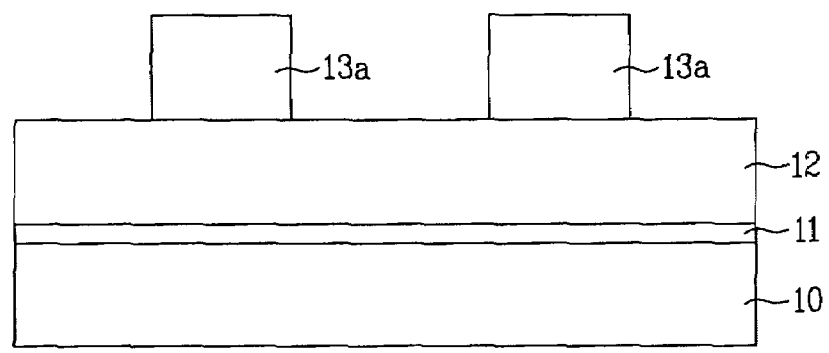
Figure 1D:
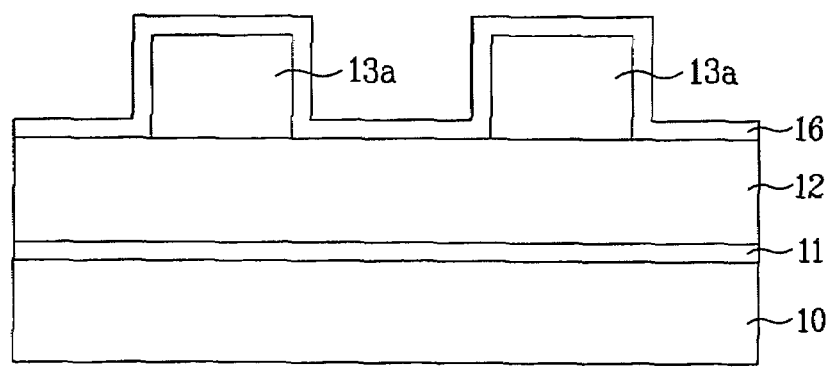
Figure 1E:
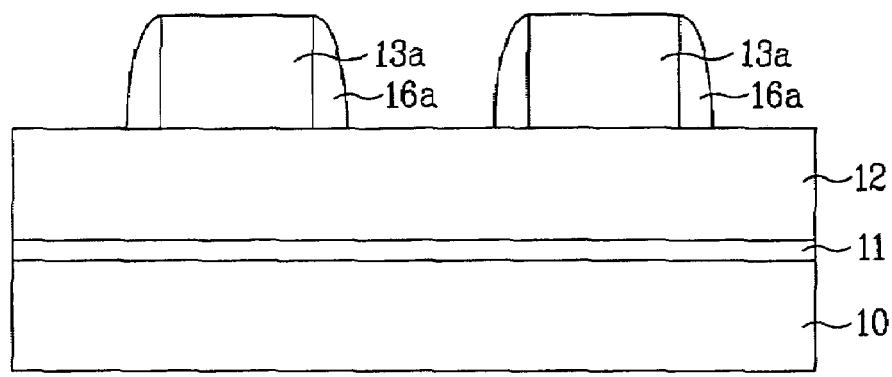
Figure 1F:
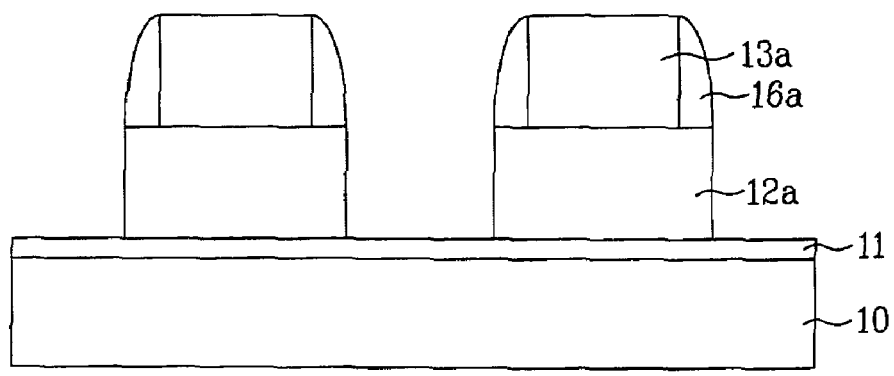
Figure 1G:
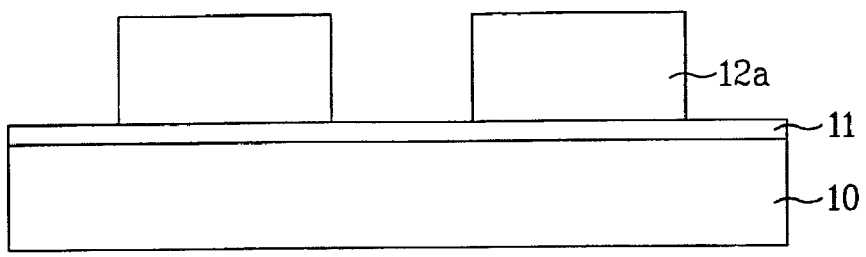
Figure 2A:
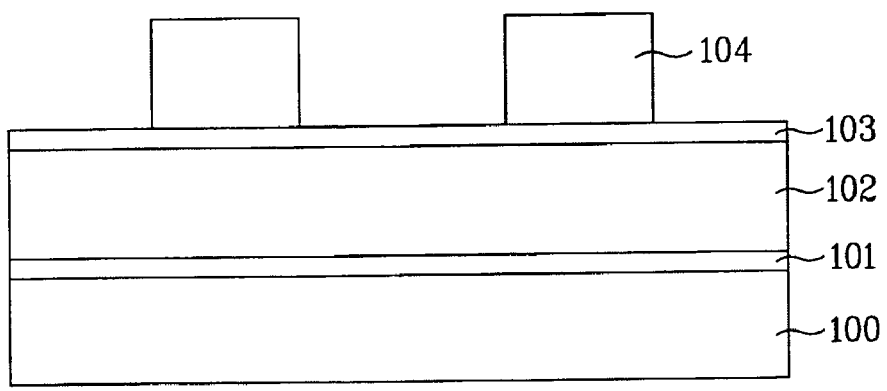
FIGS. 2A, 2B and 2C are sectional views illustrating a method for manufacturing a semiconductor device in accordance with an embodiment of the present invention.
Figure 2B:
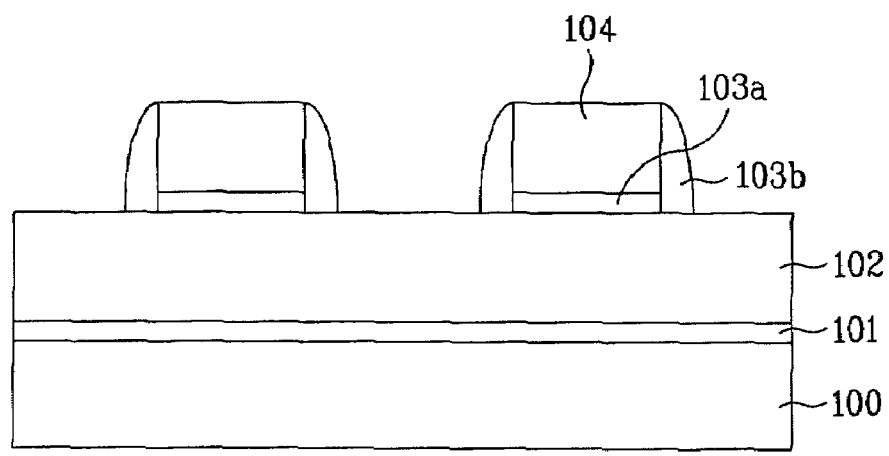
Figure 2C:
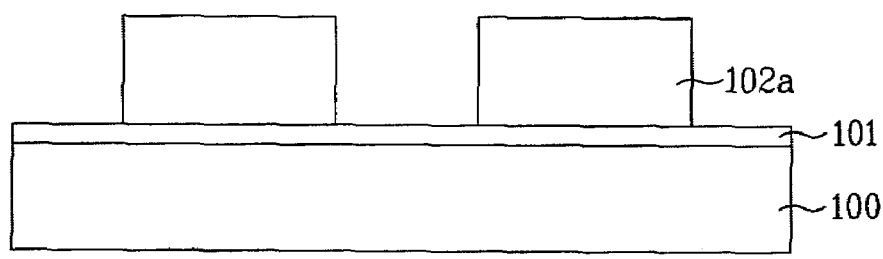

FIGS. 2A, 2B and 2C are sectional views illustrating a method for manufacturing a semiconductor device in accordance with an embodiment of the present invention.

Referring to FIG. 2A, a gate insulating layer 101, a polysilicon layer 102, and a bottom anti-reflection coating (BARC) 103 can be formed on a substrate 100.

Then, a photoresist (PR) layer can be applied to an entire top surface of the substrate 100 having the BARC 103, and can be selectively exposed and developed to form a PR layer pattern 104. Here, the BARC 103 can be used to prevent a standing wave phenomenon during the exposure process for the PR layer.

Referring to FIG. 2B, the BARC 103 can be selectively etched using the PR layer pattern 104 as a mask to form a BARC pattern 103a. In one embodiment, during the etching process, a $C_xF_y$ based reaction by-product can be generated by the etching process. The reaction by-product can be deposited on a top surface or sidewalls of the PR layer pattern 104. The structure or sidewalls formed by the reaction by-product deposited on the top surface or sidewalls of the PR layer pattern 104 can increase the actual critical dimension (CD) of the PR layer pattern 104. In a specific embodiment, the reaction by-product can be allowed to be deposited only on the top surface or the sidewalls of the PR layer pattern 104, without being deposited on a top surface of the polysilicon layer 102. If the reaction by-product is deposited on the top surface of the polysilicon layer 102, then the polysilicon layer can be prevented from being etched during a subsequent etching process because this deposition layer can function as a mask when the polysilicon layer 102 is etched.

FIG. 2B shows the reaction by-product as being formed as spacers 103b on sidewalls of the PR layer pattern 104 and the BARC pattern 103a. Although not illustrated, the reaction by-product can also be deposited on the top surface of the PR layer pattern 104.

In one embodiment, the process of etching the BARC 103 and the process of forming the spacers 103b have the following condition. The process of etching the BARC 103 and the process of forming the spacers 103b can be performed using capacitive coupled plasma (CCP) equipment, and the conditions of these processes can be as follows.

First, the process of etching the BARC 103 to form the BARC pattern 103a can be performed under the conditions of: Power from 500 W to 1000 W; Duration from 10 seconds to 20 seconds; Pressure from 40 mT to 70 mT; and Flow rate from 60 sccm to 100 sccm $CF_4$, from 100 sccm to 150 sccm Ar, and from 5 sccm to 15 sccm $O_2$. In an embodiment, a distance between a plasma source (not shown) and the substrate 100 in the CCP equipment can be set to a range from 25 mm to 30 mm.

Then, the process of depositing the reaction by-product on the PR layer pattern 104 can be performed under the conditions of: Power from 500 W to 1000 W; Duration from 15 seconds to 30 seconds; Pressure from 20 mT to 50 mT; and Flow rate from 10 sccm to 30 sccm $C_5F_8$, from 2 sccm to 10 sccm $CH_2F_2$, from 50 sccm to 100 sccm Ar, and from 0 sccm to 5 sccm $O_2$. In an embodiment, a distance between a plasma source (not shown) and the substrate 100 in the CCP equipment can be set to a range from 25 mm to 30 mm.

The etch of the BARC 103, and the deposition of the reaction by-product on the top surface and sidewalls of the PR layer pattern 104 can be performed in the CCP equipment by injecting a reactive gas having reactivity with the BARC 103, applying radio frequency (RF) power to generate plasma, and performing an etch by means of radicals.

A residence time of the reaction by-product generated when the etch is performed can be prolonged to increase a probability of attaching the reaction by-product to the PR layer pattern 104, so that the actual CD of the PR layer pattern after the deposition of the reaction by-product becomes greater than that of the PR layer pattern after the exposure process.

Thus, the polysilicon layer 102 for a gate can be etched using the PR layer pattern 104 and sidewall spacers 103b as a mask.

Referring to FIG. 2C, a gate electrode line 102a or a gate electrode can be formed by etching the polysilicon layer 102 using both the sidewall spacers 103b formed by the reaction by-product and the PR layer pattern 104 as a mask.

Where the reaction by-product is deposited on the sidewalls as well as the top surface of the PR layer pattern 104, the deposited reaction by-product itself can act as a mask, and thus hardly exerts an influence on the subsequent process, i.e. the process of etching the polysilicon layer 102.

However, in the case in which the reaction by-product remains a portion where the polysilicon layer 102 is to be etched, the remaining reaction by-product can act as a mask in the selective process of the polysilicon layer 102. Hence, the polysilicon layer 102 to be etched may not be etched, and process failures such as the bridge of a floating gate can occur.

Therefore, in a preferred embodiment, before the process of etching the polysilicon layer 102, the reaction by-product, which has been generated by etching the BARC 103 and has remained on the polysilicon layer 102 can be removed completely.

According to one embodiment of the present invention, the reaction by-product remaining on the polysilicon layer 102 can be completely removed by ion sputtering using a reactive gas based on argon (Ar) and fluorocarbon.

In a specific embodiment, the ion sputtering can be performed using $CF_4$ and Ar as the reactive gas under the conditions of: Pressure from 1 mT to 10 mT; Source Power from 200 W to 1000 W; Bias power from 20 W to 100 W; Duration from 3 seconds to 20 seconds; and Flow rate from 50 sccm to 200 sccm $CF_4$ and from 50 sccm to 200 sccm Ar.

In this manner, after the reaction by-product remaining on the polysilicon layer 102 is completely removed, the polysilicon layer 102 can be etched using the PR layer pattern 104 and the sidewall spacers 103b as a mask.

According to an embodiment of the present invention, the process of etching the polysilicon layer 102 can be performed in two steps. The first step can be performed under the conditions of: Pressure from 1 mT to 10 mT; Source Power from 300 W to 1000 W; Bias power from 50 W to 200 W; Duration from 30 seconds to 60 seconds; and Flow rate from 30 sccm to 70 sccm $Cl_2$, from 150 sccm to 300 sccm HBr, and from 0 sccm to 20 sccm $HeO_2$. The second step can be performed under the conditions of: Pressure from 50 mT to 100 mT; Source Power from 500 W to 1000 W; Bias power from 30 W to 100 W; Duration from 40 seconds to 100 seconds; and Flow rate from 300 sccm to 500 sccm HBr and from 5 sccm to 30 sccm $HeO_2$.

Subsequently, the PR layer pattern 104, the BARC pattern 103*a* underneath the PR layer pattern 104, and the sidewall spacers 103*b* can be removed. The remaining polysilicon layer pattern can be an interconnection 102*a*. In embodiments, this interconnection can serve as a gate line or a gate electrode.

In embodiments of this method for manufacturing a semiconductor device, because the pattern is formed in a constant pitch size, the actual CD of the width of the interconnection after the etch is completed can be increased up to a range from about 100 nm to about 200 nm, compared to the CD of each pattern line (or the width) of the PR layer pattern 104 after the exposure process is performed.

Accordingly, the CD of a space between the interconnections is possible to be formed having a width of 100 nm or less. In the method for manufacturing a semiconductor device in accordance with the present invention, the interconnection can be formed of a polysilicon layer.

In embodiments, a dry etch for the anisotropic etch, and particularly a plasma etch using plasma, can be performed when holding a wafer in a plasma etching bath by flowing etching gas selected for etching a particular layer on the wafer, and applying a radio frequency (RF) field having high energy, so that the gaseous molecules are excited to a high energy level, and react with the layer, thereby etching the layer.

The plasma source can be one of most important factors, and has recently undergone rapid changes. Particularly, a plasma source tries to meet reciprocal requirements such as a high etch rate, a high selectivity, a low damage, and so on. In order to meet these requirements of the plasma source, a technique using capacitive coupled plasma (CCP) and a technique using inductive coupled plasma (ICP) have been developed.

In the method for manufacturing a semiconductor device in accordance with the present invention, the equipment used to form the sidewall spacers using the reaction by-product generated when the BARC is etched can be CCP equipment. In a specific embodiment, the CCP equipment makes use of a dipole ring magnetron (DRM).

In the method for manufacturing a semiconductor device in accordance with the present invention, the exposure process can be performed on the PR layer using a KrF light source of 248 nm. The reaction by-product, generated when the BARC is etched, can be used as a hard mask together with the PR layer pattern.

As such, without a precise light source, the etching process can be performed so as to be able to form the gate pattern in which the CD of the space between the neighboring lines (hereinafter, referred to as a "line-to-line space CD") amounts to 100 nm or less.

Accordingly, the number of processes can be reduced compared to an existing process. Further, the process of manufacturing a semiconductor device having a fine line-to-line space CD can be performed without using a PR layer and equipment for an expensive ArF light source.

A method for manufacturing a semiconductor device in accordance with the present invention can have the following effects.

When the reaction by-product generated from etching the BARC is deposited on the top surface of the PR layer pattern without being immediately removed, the reaction by-product can be formed into a hard mask having a width greater than that of the PR layer pattern. Then, the polysilicon layer below the PR layer pattern can be etched using the formed hard mask to form a poly gate.

Thus, even if the PR layer and equipment for the KrF light source of 248 nm is used to form a space of the poly gate having the line-to-line space CD of 100 nm or less without using high-resolution PR layer and equipment, the reaction by-product can increase the narrow width of the PR layer pattern, which decreases the line-to-line space.

This makes it possible to use the PR layer and equipment for the KrF light source even though the design rule becomes small, and thus the same or similar effect can be obtained without using the expensive equipment (the PR layer and equipment for the ArF light source).

Embodiments of the method for manufacturing a semiconductor device in accordance with the present invention can reduce the number of processes, and therefore reduce the number of possible causes of defects that can take place when each process is performed. Accordingly, the yield can be increased.

In a further embodiment, the reaction by-product that may remain on the polysilicon layer can be completely removed prior to the process of etching the polysilicon layer to form the gate, so that process failures such as a floating gate bridge can be prevented in advance.

I claim:

1. A method for manufacturing a semiconductor device, the method comprising:
    forming a polysilicon layer on a semiconductor substrate;
    forming an anti-reflection coating on the polysilicon layer;
    forming a photoresist (PR) layer pattern on the anti-reflection coating;
    etching the anti-reflection coating using the PR layer pattern as a mask, so as to cause a reaction by-product generated by the etching of the anti-reflection coating to be deposited on sidewalls of the PR layer pattern, thereby forming spacers;
    removing the reaction by-product from polysilicon layer; and
    etching the polysilicon layer using the PR layer pattern and the spacers as a mask after removing the reaction by-product.

2. The method as claimed in claim 1, wherein the reaction by-product is removed by ion sputtering.

3. The method as claimed in claim 2, wherein the ion sputtering uses a reactive gas based on argon (Ar) and fluorocarbon.

4. The method as claimed in claim 2, wherein the ion sputtering uses $CF_4$ having a flow rate from 50 sccm to 200 sccm, and argon (Ar) having a flow rate from 50 sccm to 200 sccm.

5. The method as claimed in claim 1, wherein the anti-reflection coating is etched in capacitive coupled plasma (CCP) equipment.

6. The method as claimed in claim 5, wherein the anti-reflection coating is etched under conditions of: Power from 500 W to 1000 W; Duration from 10 seconds to 20 seconds; Pressure from 40 mT to 70 mT; and Flow rate from 60 sccm to 100 sccm $CF_4$, from 100 sccm to 150 sccm Ar, and from 5 sccm to 15 sccm $O_2$.

7. The method as claimed in claim 5, wherein the anti-reflection coating is etched using a plasma source spaced apart from the semiconductor substrate by a distance from 20 mm to 30 mm.

8. The method as claimed in claim 1, wherein, the spacers are formed under conditions of: Power from 500 W to 1000 W; Duration from 15 seconds to 30 seconds; Pressure from 20 mT to 50 mT; and Flow rate from 10 sccm to 30 sccm $C_5F_8$, from 2 sccm to 10 sccm $CH_2F_2$, from 50 sccm to 100 sccm Ar, and from 0 sccm to 5 sccm $O_2$.

9. The method as claimed in claim 1, wherein the spacers are formed in CCP equipment using a plasma source spaced apart from the semiconductor substrate by a distance from 25 mm to 30 mm.

10. A method for manufacturing a semiconductor device, the method comprising:

forming a polysilicon layer on a semiconductor substrate;
forming an anti-reflection coating on the polysilicon layer;
forming a photoresist (PR) layer pattern on the antireflection coating;
etching the anti-reflection coating using the PR layer pattern as a mask so as to cause a reaction by-product generated by etching the anti-reflection coating to be deposited on sidewalls of the PR layer pattern, thereby forming spacers, wherein the etching comprises performing an anti-reflective coating etching process with capacitive coupled plasma (CCP) equipment using $CF_4$, Ar, and $O_2$;
removing the reaction by-product from the polysilicon layer; and
etching the polysilicon layer using the PR layer pattern and the spacers as a mask after removing the reaction by-product.

11. The method as claimed in claim 10, wherein removing the reaction by-product from the polysilicon layer comprises using a reactive gas based on argon (Ar) and fluorocarbon by means of ion sputtering.

12. The method as claimed in claim 11, wherein the ion sputtering uses $CF_4$ and Ar.

13. The method as claimed in claim 10, wherein during the etching of the antireflection coating, the causing of the reaction-by product to be deposited on sidewalls of the PR layer pattern, thereby forming spacers, is performed using $C_5F_8$, $CH_2F_2$, Ar, and $O_2$.

* * * * *